(12) United States Patent  (10) Patent No.: US 7,504,927 B2
Shoji  (45) Date of Patent: Mar. 17, 2009

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 526 days.

(21) Appl. No.: 11/282,754

(22) Filed: Nov. 21, 2005

(65) Prior Publication Data

US 2006/0145690 A1  Jul. 6, 2006

(30) Foreign Application Priority Data

Dec. 6, 2004  (JP)  ............................. 2004-352212

(51) Int. Cl.
*H01L 43/00*  (2006.01)

(52) U.S. Cl. ................. 338/32 R; 324/117 R; 324/248; 360/324.11

(58) Field of Classification Search ............... 338/32 R; 324/248–249, 252, 117 R, 117 H; 360/324.11, 360/324.12
See application file for complete search history.

(56) References Cited

U.S. PATENT DOCUMENTS 4,464,625 A * 8/1984 Lienhard et al. ........ 324/117 R
5,422,571 A * 6/1995 Gurney et al. ................ 324/252
5,621,377 A    4/1997 Dettmann et al.
5,909,115 A    6/1999 Kano et al.
5,933,003 A    8/1999 Hebing et al.
6,614,211 B1 * 9/2003 Douglas ....................... 324/67

FOREIGN PATENT DOCUMENTS

JP   A-5-10979    1/1993
JP   A-10-506193  6/1998

* cited by examiner

*Primary Examiner*—Kyung Lee
(74) *Attorney, Agent, or Firm*—Oliff & Berridge, PLC

(57) ABSTRACT

The present invention provides a current sensor capable of sensing a current to be detected with high precision while realizing a compact configuration. The current sensor includes a first MR element including element patterns disposed at a first level, a second MR element including element patterns disposed at a second level, and a thin film coil which winds at a third level provided between the first and second levels while including winding body portions extending in an X axis direction in correspondence with the element patterns of the first and second MR elements, and which applies a current magnetic field to each of the element patterns when a current to be detected is supplied. Therefore, by using both of the first and second MR elements, the current magnetic field can be detected with high sensitivity and high precision.

15 Claims, 12 Drawing Sheets

CURRENT SENSOR

TECHNICAL FIELD

The present invention relates to a small-sized current sensor capable of sensing a change in current flowing in a conductor with high sensitivity.

BACKGROUND OF THE INVENTION

Hitherto, to accurately detect a small signal current flowing in a circuit in a communication device, for example, a method of connecting resistors in series in the circuit and measuring a voltage drop in the resistors is used. In this case, however, a load different from that in a communication system is applied, and there is the possibility that an adverse influence is exerted on the communication system. Consequently, a method of indirectly measuring a signal current by detecting the gradient of a current magnetic field generated by the signal current (while maintaining an insulated state so that direct current does not flow) is used. Examples of such a method are a method of using a transformer in which coils are connected to each other and a method using a photocoupler.

In the method of using the transformer, although a signal current which is an alternate current can be transmitted, a signal current which is a direct current cannot be transmitted. Moreover, a frequency band in which the signal current as the direct current can be transmitted is limited. At a frequency other than in the proper frequency band, an impedance of the transformer changes, so that it lacks linearity, and an adverse influence may be exerted on the communication device and the like. On the other hand, the photocoupler has excellent frequency characteristics, but it is difficult to reduce the size when the photocoupler is used. There is also a problem such that, in long terms, deterioration in a signal intensity caused by a change with time tends to occur.

Consequently, a current sensor in which a giant magnetoresistive element (hereinbelow, GMR element) producing a giant magnetoresistive effect is disposed in the current magnetic field generated by the signal current to detect the gradient of the current magnetic field has been proposed (refer to, for example, U.S. Pat. No. 5,621,377). A current sensor using such a GMR element has an excellent detection sensitivity and responsiveness and can obtain detection characteristics which are stable also against a temperature change.

Recently, a current sensor capable of detecting a weaker current and having a more compact general configuration is being demanded. In a current sensor using a conventional GMR element, however, a GMR element is provided so as to be adjacent to a line to be measured in an in-plane direction, so that it is difficult to detect a weak current and it is disadvantageous from the viewpoint of miniaturization.

SUMMARY OF THE INVENTION

The present invention has been achieved in consideration of such problems, and an object of the invention is to provide a current sensor capable of measuring a current to be detected with high precision while realizing a compact configuration.

A current sensor of the present invention has the following components (A) to (C).
(A) a first magnetoresistive element including a plurality of strip-shaped element patterns which extend in a first direction at a first level and are disposed so as to be adjacent to each other in a second direction orthogonal to the first direction.
(B) a second magnetoresistive element including a plurality of strip-shaped element patterns extending in the first direction and disposed so as to be adjacent to each other in the second direction at a second level different from the first level.
(C) a first thin film coil which winds at a third level positioned between the first and second levels while including a plurality of winding body portions extending in the first direction in correspondence with the element patterns of the first and second magnetoresistive elements, and which applies a first current magnetic field to each of the element patterns of the first and second magnetoresistive elements when current to be detected is supplied.

The strip shape denotes here a shape whose dimension in the first direction is larger than dimension in the second direction.

In the current sensor according to the invention, as compared with the case where the first and second magnetoresistive elements and the first thin film coil are provided so as to be adjacent to each other in an in-plane direction, the first and second magnetoresistive elements are disposed more closely to the first thin film coil. Consequently, the dimensions of the whole are reduced and, moreover, a first current magnetic field based on the current to be detected which flows in the first thin film coil is applied to each of the element patterns of the first and second magnetoresistive elements more strongly. In this case, the first current magnetic field generated by the winding body portions of the first thin film coil corresponding to the element patterns of the first and second magnetoresistive elements is applied to each of the element patterns of the first and second magnetoresistive elements. Therefore, the positions and the sectional dimensions in a section orthogonal to the first direction are easily optimized from the viewpoint of heating by the coil and a current efficiency of coil magnetic field strength. As compared with the case where a current magnetic field generated only by a current flowing in one conductor (winding body portion) is applied to each of the element patterns, the first current magnetic field can be efficiently applied to each of the element patterns.

Preferably, the current sensor of the invention is constructed so that the resistance values of the first and second magnetoresistive elements change in directions opposite to each other in accordance with the first current magnetic field.

Preferably, the current sensor of the invention further includes: a third magnetoresistive element which includes a plurality of strip-shaped element patterns extending in the first direction and disposed so as to be adjacent to each other in the second direction, and which is formed in a region other than a region where the first magnetoresistive element at the first level is formed so as to be connected in series to the first magnetoresistive element; a fourth magnetoresistive element which includes a plurality of strip-shaped element patterns extending in the first direction and disposed so as to be adjacent to each other in the second direction and which is formed in a region other than a region where the second magnetoresistive element at the second level is formed so as to be connected in series to the second magnetoresistive element; and a second thin film coil which winds in a region other than a region where the first thin film coil at the third level is formed so as to include a plurality of winding body portions extending in the first direction in correspondence with the element patterns of the third and fourth magnetoresistive elements, and which applies a second current magnetic field to each of the element patterns of the third and fourth magnetoresistive elements when the current to be detected is supplied.

In the above case, preferably, a resistance value of the second magnetoresistive element changes in the direction opposite to that of the first magnetoresistive element in accordance with the first current magnetic field, a resistance value of the third magnetoresistive element changes in the direction opposite to that of the first magnetoresistive element generated by the first current magnetic field in accordance with the second current magnetic field, and a resistance value of the fourth magnetoresistive element changes in the same direction as that of the first magnetoresistive element generated by the first current magnetic field in accordance with the second current magnetic field.

Further in the above case, a bridge circuit may be constructed in such a manner that one end of the first magnetoresistive element and one end of the second magnetoresistive element are connected to each other at a first connection point, one end of the third magnetoresistive element and one end of the fourth magnetoresistive element are connected to each other at a second connection point, further, the other end of the first magnetoresistive element and the other end of the fourth magnetoresistive element are connected to each other at a third connection point, and the other end of the second magnetoresistive element and the other end of the third magnetoresistive element are connected to each other at a fourth connection point and, on the basis of a potential difference between the third and fourth connection points occurring when a voltage is applied across the first and second connection points, the current to be detected is detected.

In the current sensor of the invention, the element patterns in each of the first to fourth magnetoresistive elements may be connected in parallel to each other or in series to each other.

In the current sensor of the invention, preferably, each of the element patterns in the first to fourth magnetoresistive elements has a magnetization pinned film magnetized in the first direction. Further, it is preferable that each of the element patterns in the first to fourth magnetoresistive elements be constructed so that the longitudinal dimension along the first direction is 10 times to 200 times as large as the width dimension along the second direction. In this case, the width dimension along the second direction is preferably in a range from 0.5 µm to 2.0 µm. Further, it is preferable that each of the winding body portions in the first and second thin film coils have a section area which is from 0.4 µm$^2$ to 2.0 µm$^2$ in a cross section orthogonal to the first direction. In this case, for example, the winding body portion has a width dimension in a range from 0.8 µm to 3.0 µm and a thickness dimension in a range from 0.2 µm to 1.4 µm.

According to the invention, the current sensor includes: first and second magnetoresistive elements including a plurality of strip-shaped element patterns extending at the first and second levels, respectively; and a first thin film coil which winds at a third level while including a plurality of winding body portions corresponding to the element patterns of the first and second magnetoresistive elements, and which applies a first current magnetic field to each of the element patterns of the first and second magnetoresistive elements when a current to be detected is supplied. Thus, while realizing a compact configuration, the current to be detected that flows in the first thin film coil can be measured with high sensitivity and high precision by using both of the first and second magnetoresistive elements.

In the case, particularly, when the element patterns in the first magnetoresistive element are connected in parallel to each other, the resistance value as a whole can be suppressed to be relatively low without decreasing the resistance change ratio in the first magnetoresistive element, and a heating value of the first magnetoresistive element at the time of use can be reduced. Moreover, the influence of noise from the outside (unnecessary magnetic fields) is reduced, and the S/N ratio can be improved. On the other hand, when the element patterns are connected in series to each other, without increasing the dimension in the first direction, the total length of the element patterns functioning as magnetosensitive parts can be increased, and the absolute value of the resistance value (impedance) of the whole in the first magnetoresistive element can be made larger. Therefore, even a weaker current to be detected can be measured with high precision.

When the current sensor of the invention includes, in addition to the first and second magnetoresistive elements and the first thin film coil, the third magnetoresistive element formed at the first level so as to be connected in series to the first magnetoresistive element, the fourth magnetoresistive element formed at the second level so as to be connected in series to the second magnetoresistive element, and the second thin film coil for applying the current magnetic field to each of the element patterns of the third and fourth magnetoresistive elements, the current to be detected is measured by using the four magnetoresistive elements. Consequently, the reliability of a measurement values of the current to be detected is improved more than the case of using two magnetoresistive elements. In this case, if a bridge circuit is constructed by using first to fourth magnetoresistive elements, the influence of variations in the characteristics among the magnetoresistive elements is reduced. Accordingly, the precision of the measurement can be further increased.

DETAILED DESCRIPTION OF THE PREFERRED EMBODIMENTS

Embodiments of the invention will be described in detail hereinbelow with reference to the drawings

First Embodiment

Figure 1:
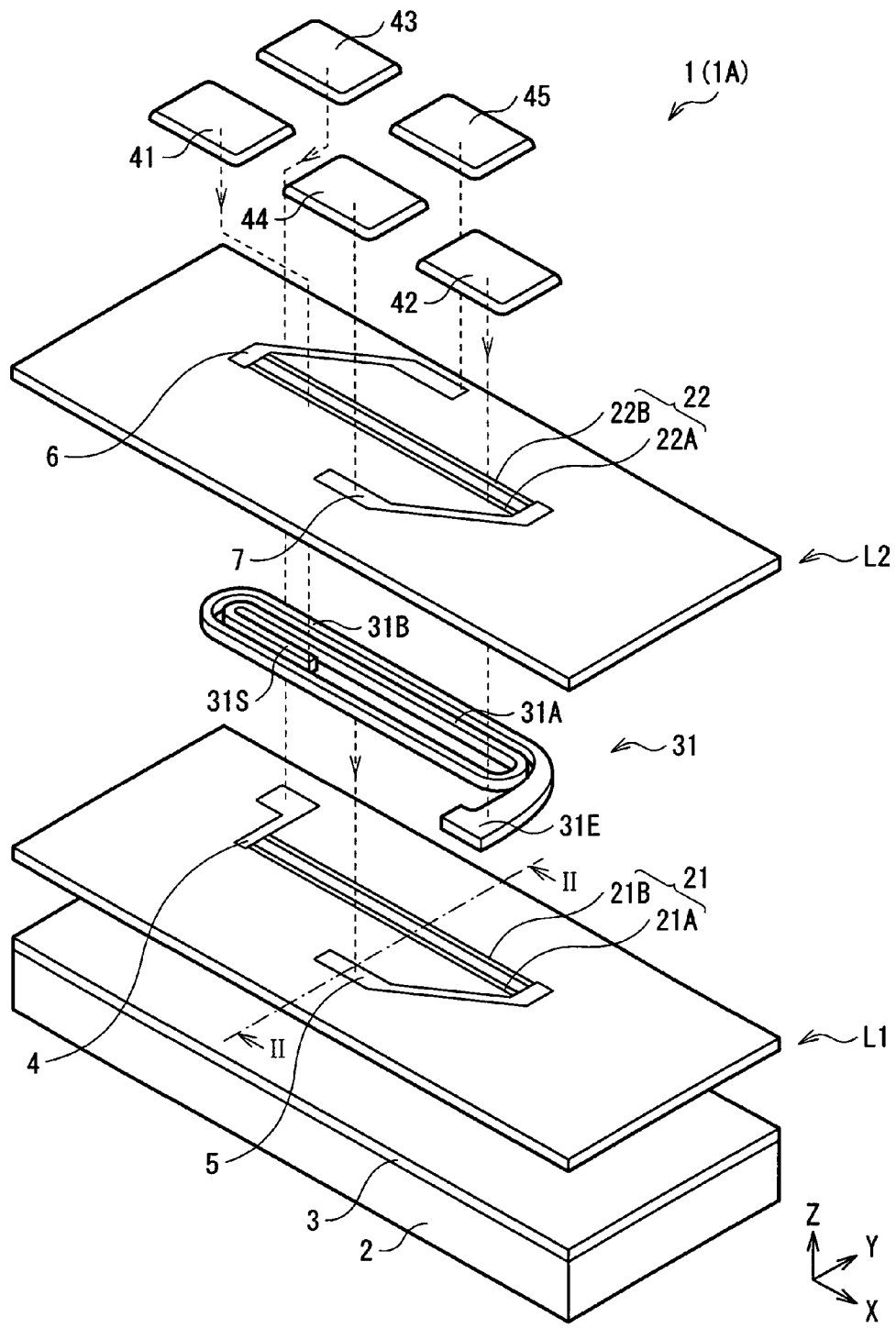
FIG. 1 is a perspective view showing the configuration of a current sensor according to a first embodiment of the invention.
Figure 2:
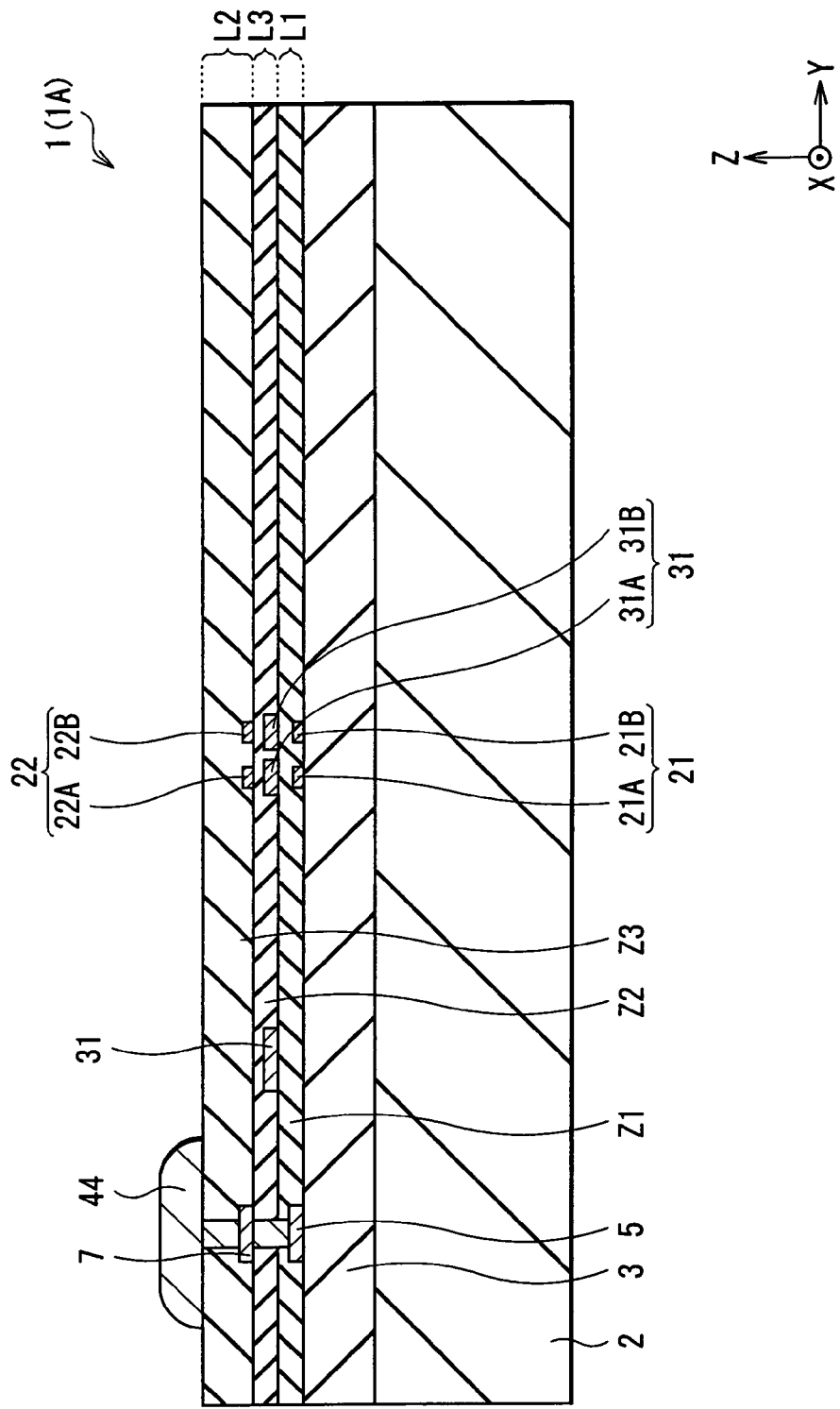
FIG. 2 is a cross section taken along line II-II of the current sensor illustrated in FIG. 1.

First, the configuration of a current sensor as a first embodiment of the invention will be described with reference to FIGS. 1 and 2. FIG. 1 is a schematic view illustrating a perspective configuration of a current sensor 1 of the first embodiment. FIG. 2 is a cross section taken along line II-II of the current sensor 1 illustrated in FIG. 1 seen from the direction indicated by the arrows (−X direction). The current sensor 1 is mounted on, for example, a communication device and is used for accurately measuring a current as a control signal. To distinguish the current sensor of the first embodiment from that of a second embodiment to be described later and the like, the current sensor in the first embodiment will be called a current sensor 1A.

The current sensor 1A has a configuration obtained by sequentially stacking, on a substrate 2 made of silicon (Si) or the like via a base film 3 made of aluminum oxide ($Al_2O_3$) or the like, a first-level L1 including a first magnetoresistive element 21 (hereinbelow, simply called the MR element 21), a third level L3 including a first thin film coil 31 (hereinbelow, simply called the thin film coil 31), and a second level L2 including a second magnetoresistive element 22 (hereinbelow, simply called the MR element 22). Concretely, the MR element 21 has two element patterns 21A and 21B extending in a first direction (X axis direction) at the first level L1. The MR element 22 has two element patterns 22A and 22B extending in the X axis direction at the second level L2. Further, the thin film coil 31 winds at the third level L3 while including a winding body portion 31A extending in the X axis direction in correspondence with each of the element patterns 21A and 22A and a winding body portion 31B extending in the X axis direction in correspondence with each of the element patterns 21B and 22B.

In the cross section of FIG. 2, the MR element 21, the thin film coil 31, and the MR element 22 are covered with insulating films Z1 to Z3 made of $Al_2O_3$ or the like, respectively, and electrically insulated from each other. Moreover, a plurality of electrode films 41 to 44 (shown in FIG. 1) are provided on the insulating film Z3.

The thin film coil 31 is a thin film pattern made of a metal material having high conductivity such as copper (Cu), and to which a current Im to be detected such as a control signal or the like is supplied. In the thin film coil 31, one end 31S is connected to the electrode film 41 via a contact layer (not shown) and the other end 31E is connected to the electrode film 42 via a contact layer (not shown)(refer to FIG. 1). The current sensor 1A is set so that the current Im to be detected flows from the end 31S to the end 31E.

The element patterns 21A and 21B and the element patterns 22A and 22B detect first current magnetic fields Hm1 (which will be described later) generated by a current Im to be detected, and which are provided in areas corresponding to the winding body portions 31A and 31B of the thin film coil 31 in the stacking direction, respectively. The element patterns 21A and 21B are disposed so as to extend in the X axis direction and be adjacent to each other in the Y axis direction (second direction) orthogonal to the X axis direction, and connected in parallel to each other between electrode patterns 4 and 5. Similarly, the element patterns 22A and 22B are disposed so as to extend in the X axis direction and be adjacent to each other in the Y axis direction, and connected in parallel to each other between electrode patterns 6 and 7. Each of the element patterns 21A and 21B and the element patterns 22A and 22B is formed so as to have a thickness of, for example, 0.8 μm by sputtering or the like. The electrode pattern 4 is connected to the electrode film 43 via a contact layer (not shown) and the electrode pattern 5 is connected together with the electrode pattern 7 via a contact layer (not shown) to the electrode film 44. The electrode pattern 6 is connected to an electrode film 45.

The element patterns 21A and 21B and the element patterns 22A and 22B are constructed in such a manner that, when a read current flows, the resistance values change in accordance with the first current magnetic fields Hm1 generated by the currents Im to be detected flowing in the thin film coils 31A and 31B. In this case, the resistance values of element patterns 21A and 21B and those of the element patterns 22A and 22B change in directions opposite to each other.

Figure 3:
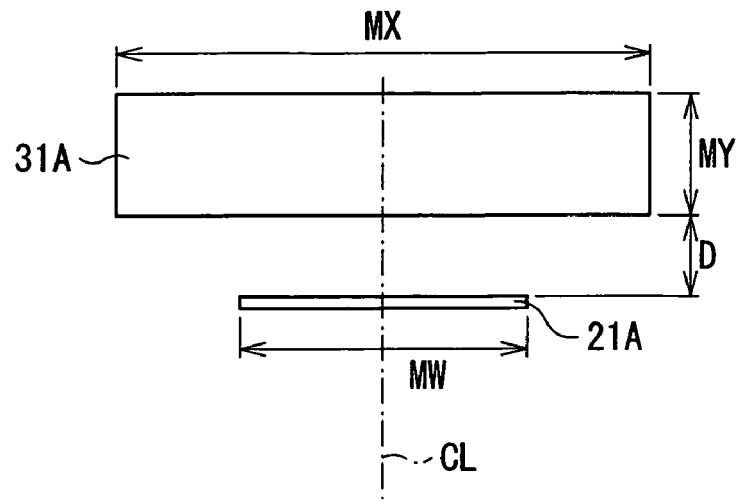
FIG. 3 is an enlarged cross section of a main part of FIG. 2.

FIG. 3 is an enlarged cross section of a main part of FIG. 2 and representatively shows the winding body portion 31A and element pattern 21A. The winding body portion 31A and element pattern 21A are disposed so that their center positions in the Y axis direction coincide with each other (that is, their center positions exist on a virtual center line CL extending in the X axis direction) and so as to be separated from each other by a distance D in the Y axis direction. The distance D is preferably 0.2 μm or more from the viewpoint of insulation resistance. Specifically, when the thickness of the insulating film Z1 by which the winding body portion 31A and the element pattern 21A are separated is 0.2 μm or more, the winding body portion 31A and the element pattern 21A can withstand instant application of 700V. From the viewpoint of realization of compactness, the distance D is preferably as small as possible. Concretely, the thickness D is preferably 1.0 μm or less.

The range of a section area S in a YZ cross section (cross section orthogonal to the X axis direction) of the winding body portion 31A is preferably from 0.4 $\mu m^2$ to 2.0 $\mu m^2$. When the cross section area S is less than 0.4 $\mu m^2$, there is the possibility that excessive temperature rise (for example, exceeding 1.0° C.) occurs due to the current Im to be detected flowing in the winding body portion 31A (since the current sensor 1A of the embodiment detects a control signal of a communication device or the like, the magnitude of the current Im to be detected lies in a range from 2 mA to 50 mA) and detection precision deteriorates. On the other hand, when the cross section area S exceeds 2.01 $m^2$, the strength of the current magnetic fields Hm1 decreases and it becomes difficult to stably perform detecting operation by the element pattern 21A.

The winding body portion 31A having such a cross section area S is constructed to have, for example, a width MX in a range from 0.8 μm to 3.0 μm and a thickness MY in a range from 0.2 μm to 1.4 μm in the YZ cross section orthogonal to the X axis direction. A width MW of the element pattern 21A in the Y axis direction is preferably 2.0 μm or less so that the current magnetic field Hm1 which is sufficiently uniform in the whole Y axis direction is applied to the element pattern 21A. On the other hand, the lower limit of the width MW is preferably 0.5 μm in order to form a uniform film in the Y axis direction. Although only the relation between the winding body portion 31A and element pattern 21A is shown in FIG. 3, preferably, the relation between the winding body portion 31A and element pattern 22A is the same. Moreover, the relation between the winding body portion 31B and each of the element patterns 21B and 22B is preferably the same.

Figure 4:
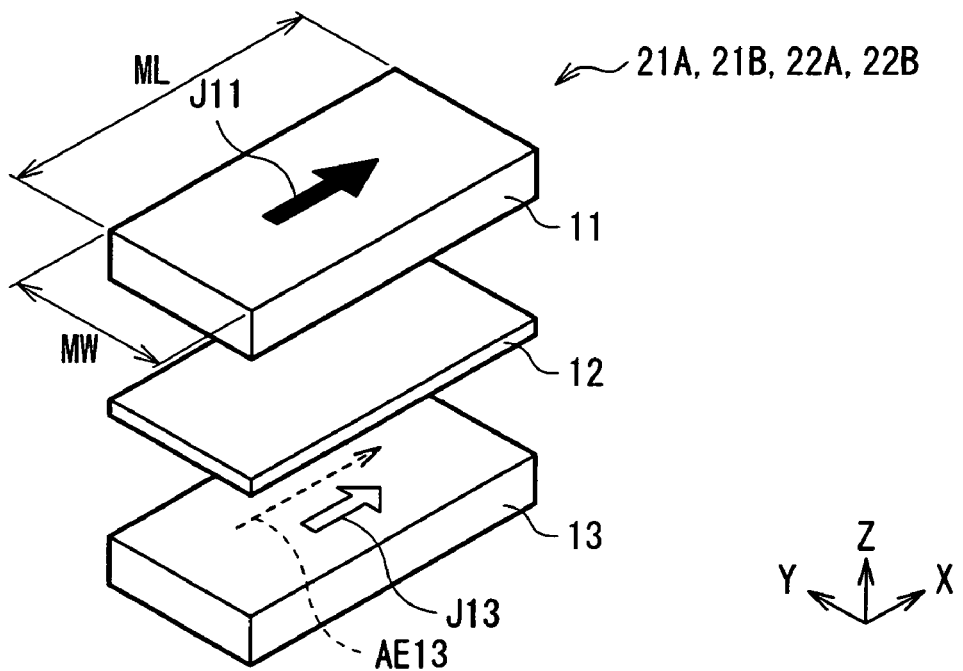
FIG. 4 is an exploded perspective view showing the configuration of a magnetoresistive element as a main part of the current sensor illustrated in FIG. 1.

Next, the configuration of the element patterns 21A and 21B will be described in more details with reference to FIGS. 4 to 7. FIG. 4 is an exploded perspective view showing the configuration of the element patterns 21A, 21B, 22A, and 22B. However, the ratio of dimensions does not coincide with the actual one.

As shown in FIG. 4, each of the element patterns 21A, 21B, 22A, and 22B has a spin valve structure in which a plurality of function films including magnetic layers are stacked, and includes a pinned layer 11 having a magnetization direction J11 pinned in the +X direction, a free layer 13 whose magnetization direction J13 changes according to external magnetic fields H such as the current magnetic field Hm1, and an intermediate layer 12 which is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu), whose top face is in contact with the pinned layer 11 and whose under face is in contact with the free layer 13. The intermediate layer 12 can be made of a nonmagnetic metal having high conductivity such as gold (Au) in addition to copper. Each of the top face of the pinned layer 11 (the face on the side opposite to the intermediate layer 12) and the under face of the free layer 13 (the face on the side opposite to the intermediate layer 12) is protected with a not-shown protection film. Exchange bias magnetic fields Hin in the magnetization direction J11 (hereinbelow, simply called "exchange bias magnetic fields Hin") are generated between the pinned layer 11 and the free layer 13 and act each other via the intermediate layer 12. The strength of the exchange bias magnetic field Hin changes as the spin direction in the free layer 13 rotates according to the interval between the pinned layer 11 and the free layer 13 (that is, the thickness of the intermediate layer 12). Although FIG. 4 shows a configuration example of the case where the free layer 13, the intermediate layer 12, and the pinned layer 11 are stacked in order from the bottom, the invention is not limited to the configuration. The layers may be stacked in the opposite order.

The element patterns 21A, 21B, 22A and 22B are constructed so that a length ML in the X axis direction (longitudinal dimension) is in a range between 10 times and 200 times as large as the width MW (width dimension) in the Y axis direction. Concretely, a preferable range of the length ML is, for example, from 20 μm to 100 μm. In such a manner, each of the element patterns 21A and 21B has a strip shape having the length ML whose dimension is larger than the width MW, so that magnetic shape anisotropy is displayed along the Y axis direction. Therefore, in the case where external magnetic fields H are applied in the +Y direction (or -Y direction), linearity of change in the resistance change ratio improves against change in the external magnetic fields H. In this case, if the length ML (longitudinal dimension) is less than 10 times as large as the width MW (width dimension) in the Y axis direction, a sufficient shape anisotropy magnetic field can not be obtained. On the other hand, a dimension ratio that exceeds 100 times is also unpreferable since improvement in the shape anisotropy magnetic field cannot be expected and noise occurs due to increase in the resistance value.

Figure 5:
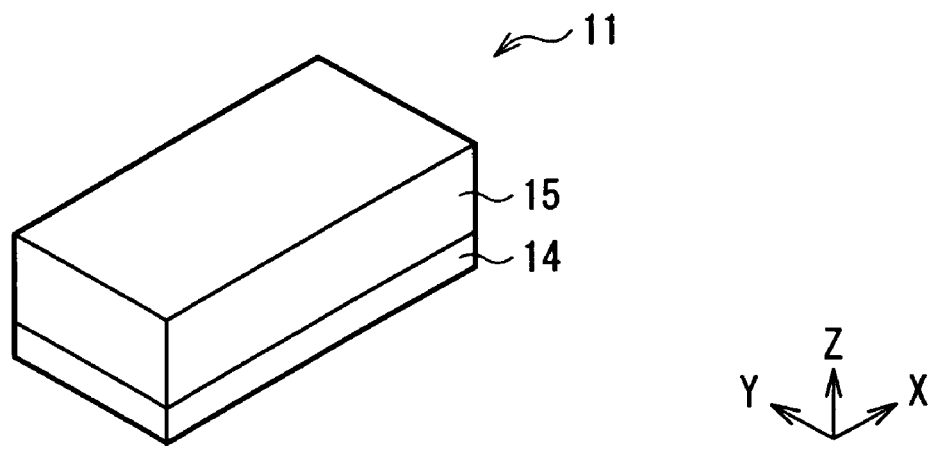
FIG. 5 is a perspective view showing the configuration of a part of the magnetoresistive element illustrated in FIG. 4.

FIG. 5 shows a detailed configuration of the pinned layer 11. The pinned layer 11 has a configuration in which a magnetization pinned film 14 and an antiferromagnetic film 15 are stacked in order from the side of the intermediate layer 12. The magnetization pinned film 14 is made of a ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of an antiferromagnetic material such as platinum manganese alloy (PtMn) or iridium manganese alloy (IrMn). The antiferromagnetic film 15 is in the state where the spin magnetic moment in the +X direction and that in the opposite direction (-X direction) completely cancel out each other, and functions so as to pin the magnetization direction J11 of the magnetization pinned film 14.

In the element patterns 21A, 21B, 22A, and 22B constructed as described above, the magnetization direction J13 of the free layer 13 rotates by application of the current magnetic field Hm1, thereby changing a relative angle between the magnetization directions J13 and J11. The relative angle is determined according to the magnitude and the direction of the current magnetic field Hm1.

Figure 6:
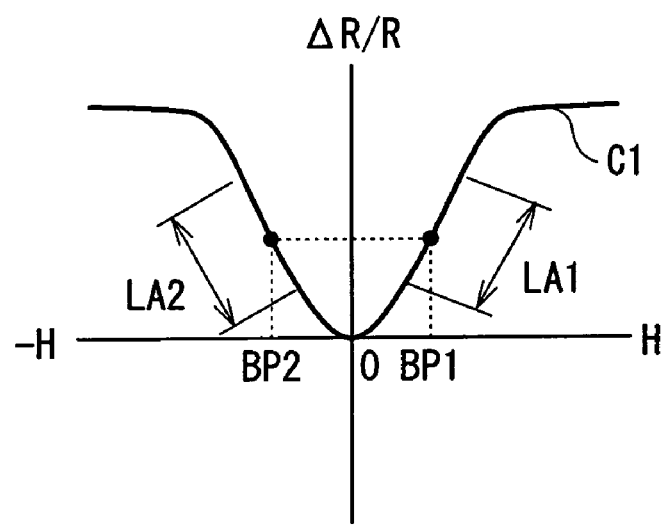
FIG. 6 is a characteristic diagram showing a magnetic field dependency of a resistance change ratio in the magnetoresistive element illustrated in FIG. 4.

FIG. 4 shows a no load state where the current magnetic field Hm1 is zero (Hm=0) and the other magnetic fields (such as the bias magnetic field) are not applied (that is, the state where the external magnetic field H is zero). Since an easy magnetization axis direction AE13 of the free layer 13 is set so as to be parallel with the magnetization direction J11 of the pinned layer 11, all of the easy magnetization axis direction AE13 and the magnetization directions J13 and J11 are parallel with each other along the +X direction in this state. Consequently, the spin directions of magnetic domains in the free layer 13 align in almost the same direction. In the case where the external magnetic field H is applied to the element patterns 21A, 21B, 22A, and 22B in the direction orthogonal to the magnetization direction J11 (+Y direction or -Y direction), characteristics as shown in FIG. 6 are obtained. FIG. 6 shows the relation between the external magnetic field H and the resistance change ratio ΔR/R when the external magnetic field H in the +Y direction is assumed to be positive. The relation is the smallest (ΔR/R=0) when the external magnetic field H is zero (H=0), and is expressed by a curve C1 which hardly shows hysteresis. In this case, 1/f noise caused by hysteresis is extremely small, so that high-sensitive and stable sensing can be performed.

Figure 7:
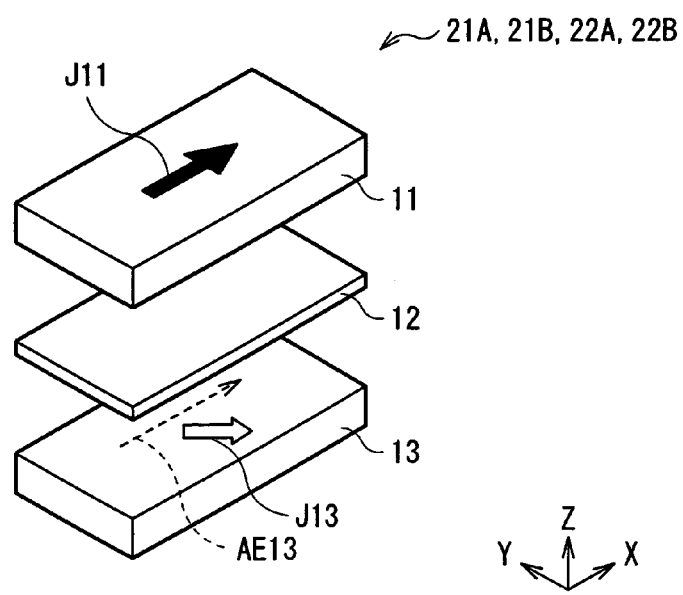
FIG. 7 is another exploded perspective view showing the configuration of the magnetoresistive element as a main part of the current sensor illustrated in FIG. 1.

As is evident from FIG. 6, however, a linear change cannot be obtained in a range around zero of the external magnetic field H (H=0). Therefore, in the case of actually measuring the current magnetic field Hm1, by applying a bias magnetic field generated by a not-shown permanent magnet or the like in a direction orthogonal to the magnetization direction J11, as shown in FIG. 7, the magnetization direction J13 is turned to be slightly tilted so as to include a component in the +Y direction or a component in the -Y direction (FIG. 7 shows the case where the magnetization direction J13 is tilted to the -Y direction). In such a manner, a change in the current magnetic field Hm1 can be detected with high precision in linear areas LA1 and LA2 having bias points BP1 and BP2 as center points, respectively, shown in FIG. 6.

Figure 8:
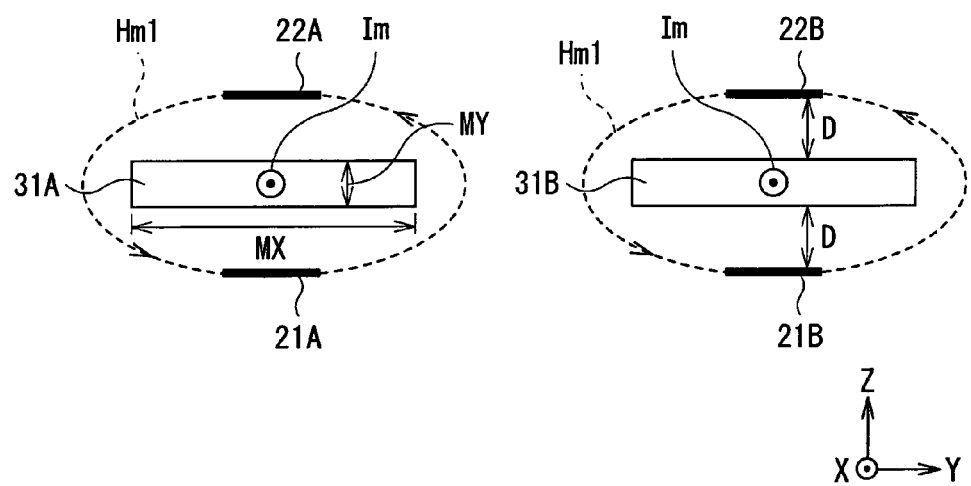
FIG. 8 is another enlarged cross section of a main part of FIG. 2.

A method of sensing the current Im to be detected by the current sensor 1A having the configuration as described above will be described hereinbelow with reference to FIGS. 8 and 9 in addition to FIGS. 1 to 7.

In the case of performing sensing by using the current sensor 1A, for example, a bias magnetic field having a strength corresponding to a bias point BP1 (refer to FIG. 6) is preliminarily applied in the +Y direction to each of the element patterns 21A, 21B, 22A, and 22B in the MR elements 21 and 22. In the state, the current Im to be detected is supplied to the thin film coil 31 via the electrode films 41 and 42, and the current magnetic field Hm1 generated by the winding body portions 31A and 31B is detected by the element patterns 21A, 21B, 22A, and 22B. For example, when the current Im to be detected is passed from the end 31S toward the end 31E of the thin film coil 31, as shown in FIG. 8, the current Im to be detected flows in the +X direction (from the back to this side in the diagram) in the winding body portions 31A and 31B. As a result, a current magnetic field Hm1 winding around each of the winding body portions 31A and 31B (in a counterclockwise direction in the diagram) is generated according to the right-handed screw rule. Therefore, the current magnetic field Hm1 in the +Y direction is applied to each of the element patterns 21A and 21B, so that, as is evident from FIG. 6, the resistance change ratio increases (the resistance value increases). On the other hand, the current magnetic field Hm1 in the −Y direction is applied to the element patterns 22A and 22B, so that, as is obvious from FIG. 8, the resistance change ratio decreases (the resistance value decreases). In this configuration, the dimensions of the winding body portions 31A and 31B in the YZ cross section are equal to each other and, moreover, the distances D in the stacking direction (the Z axis direction) between the winding body portions 31A and 32B and the MR elements 21 and 22 are equal to each other. Consequently, the absolute values of the current magnetic fields Hm1 applied to the element patterns 21A, 21B, 22A, and 22B are equal to each other. FIG. 8 is an enlarged view of a part of FIG. 2, and an explanatory diagram for illustrating actions of the current magnetic fields Hm1 to the element patterns 21A, 21B, 22A, and 22B.

Figure 9:
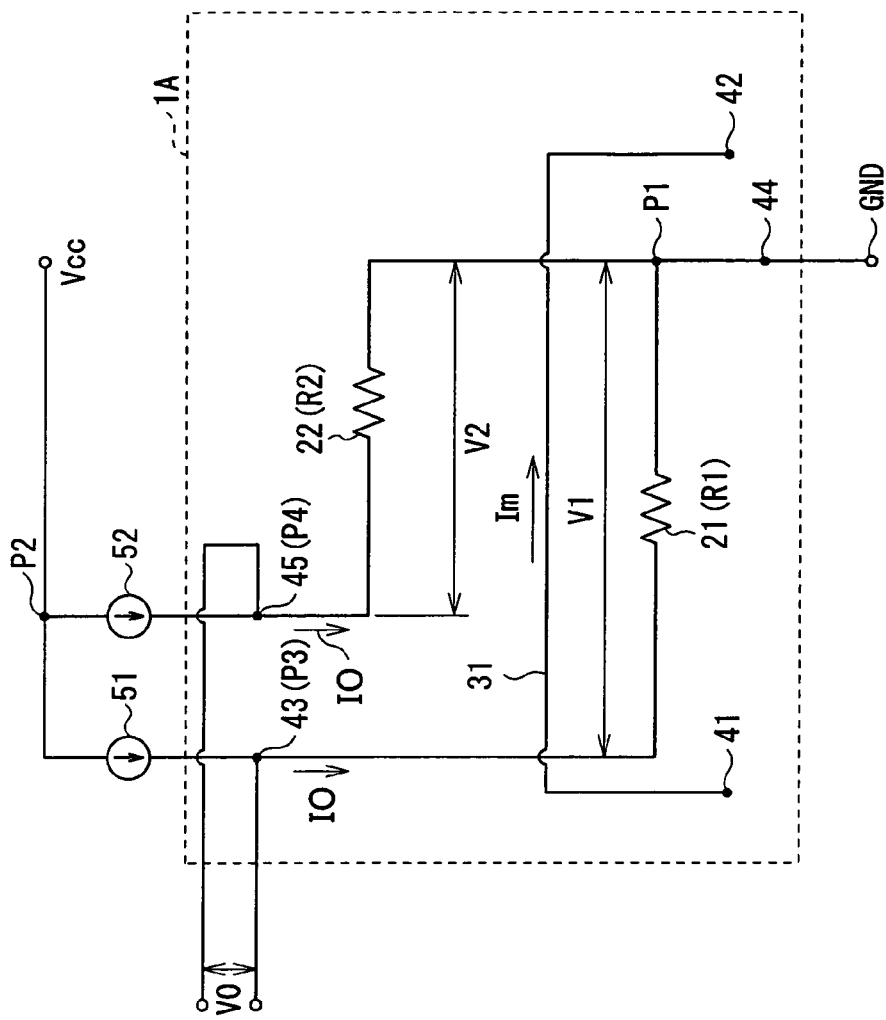
FIG. 9 is a circuit diagram corresponding to the current sensor shown in FIG. 1.

FIG. 9 shows a circuit configuration of an ammeter including the current sensor 1A. In FIG. 9, a portion surrounded by a broken line corresponds to the current sensor 1A. As shown in FIG. 9, in the current sensor 1A, the MR elements 21 and 22 and thin film coil 31 are disposed close to each another. In this configuration, each of the MR elements 21 and 22 is expressed as a single resistor obtained by connecting a plurality of element patterns in parallel. The MR elements 21 and 22 are coupled to each other at a first connection point P1 (the electrode pattern 7) and finally grounded via the electrode film 44. On the side opposite to the first connection point P1 of the MR elements 21 and 22, constant current sources 51 and 52 which are coupled to each other at a second connection point P2 are provided. Concretely, an end on the side opposite to the first connection point P1 in the MR element 21 is connected to the constant current source 51 via the electrode film 43 as a third connection point P3. An end on the side opposite to the first connection point P1 in the MR element 22 is connected to the constant current source 52 via the electrode film 45 as a fourth connection point P4. The constant current sources 51 and 52 supply constant currents I0 whose values are equal to each other to the MR elements 21 and 22.

In the current sensor 1A having such a configuration, when a voltage is applied across the first and second connection points P1 and P2, the magnitude of the current magnetic field Hm1 can be obtained on the basis of a potential difference V0 between the third and fourth connection points P3 and P4 (the difference between voltage drops generated in the MR elements 21 and 22), and the magnitude of the current Im to be detected which generates the current magnetic field Hm1 having the same magnitude can be estimated. It will be concretely described hereinbelow.

In FIG. 9, constant currents from the constant sources 51 and 52 when a predetermined voltage is applied across the first and second connection points P1 and P2 are expressed as I0 and the resistance values of the whole MR elements 21 and 22 are expressed as R1 and R2, respectively. In the case where the current magnetic field Hm1 is not applied, a potential V1 at the third connection point P3 (the electrode film 43) is expressed as follows.

$$V1 = I0 \cdot R1$$

A potential V2 at the fourth connection point P4 (the electrode film 45) is expressed as follows.

$$V2 = I0 \cdot R2$$

Therefore, the potential difference between the third and fourth connection points P3 and P4 is expressed by the following equation.

$$\begin{aligned} V0 &= V1 - V2 \\ &= I0 \cdot R1 - I0 \cdot R2 \\ &= I0 \cdot (R1 - R2) \end{aligned} \quad (1)$$

In this circuit, by measuring the potential difference V0 when the current magnetic field Hm1 is applied, the resistance change amount in each of the MR elements 21 and 22 is obtained. For example, on assumption that when the current magnetic field Hm1 is applied, the resistance values R1 and R2 increase only by change amounts ΔR1 and ΔR2, respectively, Equation (1) is calculated as follows.

$$\begin{aligned} V0 &= V1 - V2 \\ &= I0 \cdot (R1 - R2) \\ &= I0 \cdot \{(R1 + \Delta R1) - (R2 + \Delta R2)\} \end{aligned} \quad (2)$$

As already described above, the MR elements 21 and 22 are disposed so that the resistance values R1 and R2 change in directions opposite to each other in accordance with the current magnetic field Hm1. Accordingly, the positive and negative signs of the change amounts ΔR1 and ΔR2 are opposite to each other. Therefore, in Equation (2), while the resistance values R1 and R2 before application of the current magnetic fields Hm1 cancel out each other, the change amounts ΔR1 and ΔR2 are maintained as they are.

When it is assumed that the MR elements 21 and 22 have the same characteristics, that is, $$R1 = R2 = R \text{ and}$$

$$\Delta R1 = -\Delta R2 = \Delta R,$$

Equation (2) is calculated as follows.

$$\begin{aligned} V0 &= I0 \cdot (R1 + \Delta R1 - R2 - \Delta R2) \\ &= I0 \cdot (R + \Delta R - R + \Delta R) \\ &= I0 \cdot (2\Delta R) \end{aligned} \quad (3)$$

Therefore, by using the MR elements 21 and 22 whose relation between an external magnetic field and a resistance change amount is grasped in advance, the magnitude of the current magnetic field Hm1 can be measured, and the magnitude of the current Im to be detected which generates the current magnetic field Hm1 of the same magnitude can be estimated. In this case, sensing is performed by using the two MR elements 21 and 22, so that the resistance change amount which is twice as large as that in the case of performing sensing using the MR element 21 or 22 singly can be obtained. Thus, the invention is advantageous with respect to higher precision of a measurement value.

According to the current sensor 1A of the embodiment as described above, the MR elements 21 and 22 are provided in positions corresponding to the thin film coil 31 in the stacking direction. Consequently, as compared with the case where the thin film coil 31 and the MR elements 21 and 22 are provided so as to be adjacent to each other in an in-plane direction, they can be disposed closer to each other, so that the dimensions of the whole decrease. Further, the current magnetic field Hm1 based on the current Im to be detected flowing in the winding body portions 31A and 31B of the thin film coil 31 can be individually applied to each of the element patterns 21A, 21B, 22A, and 22B of the MR elements 21 and 22 by the winding body portions 31A and 31B of the thin film coil 31. Therefore, optimization of the dispose positions and cross section dimensions in the cross section orthogonal to the first direction can be easily realized from the viewpoint of heating by the coil and current efficiency of coil magnetic field strength. As compared with the case where a current magnetic field generated only by a current flowing in one conductor (winding body portion) is applied to each of element patterns, the current magnetic field Hm1 can be efficiently applied to each of the element patterns 21A, 21B, 22A, and 22B. As a result, the current Im to be detected can be detected with high sensitivity.

In particular, the element patterns 21A and 21B are connected in parallel to each other and the element patterns 22A and 22B are connected in parallel to each other, so that the resistance value of the whole first MR element 21 can be suppressed to be relatively low without decreasing the resistance change ratio, and a heating value at the time of use can be reduced. Moreover, the influence of noise from the outside (unnecessary magnetic fields) is reduced and the S/N ratio can be improved. In addition, the current magnetic field Hm1 can be detected by both of the MR elements 21 and 22. In this configuration, the resistance value R1 of the MR element 21 and the resistance value R2 of the MR element 22 change in directions opposite to each other. Consequently, on the basis of the difference V0 between voltage drops that occur when the constant currents I0 which are equal to each other are passed to the MR elements 21 and 22, the current Im to be detected can be measured with high precision. For the above reasons, the current sensor 1A can measure the current Im to be detected flowing in the thin film coil 31 with high precision while maintaining the compact configuration.

Second Embodiment

Next, a current sensor 1B as a second embodiment of the invention will be described with reference to FIGS. 10 and 11.

Figure 10:
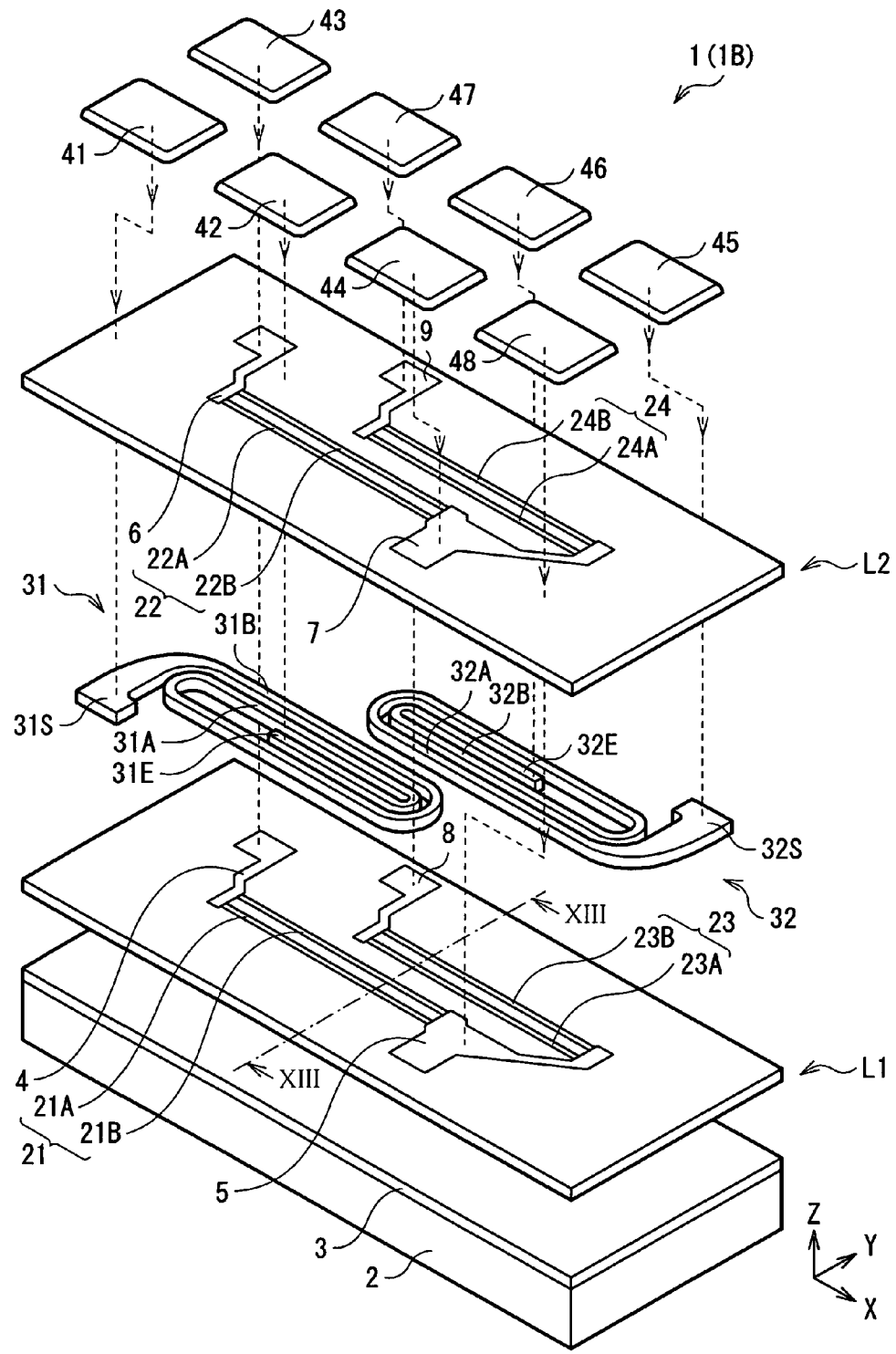
FIG. 10 is a perspective view showing the configuration of a current sensor according to a second embodiment of the invention.
Figure 11:
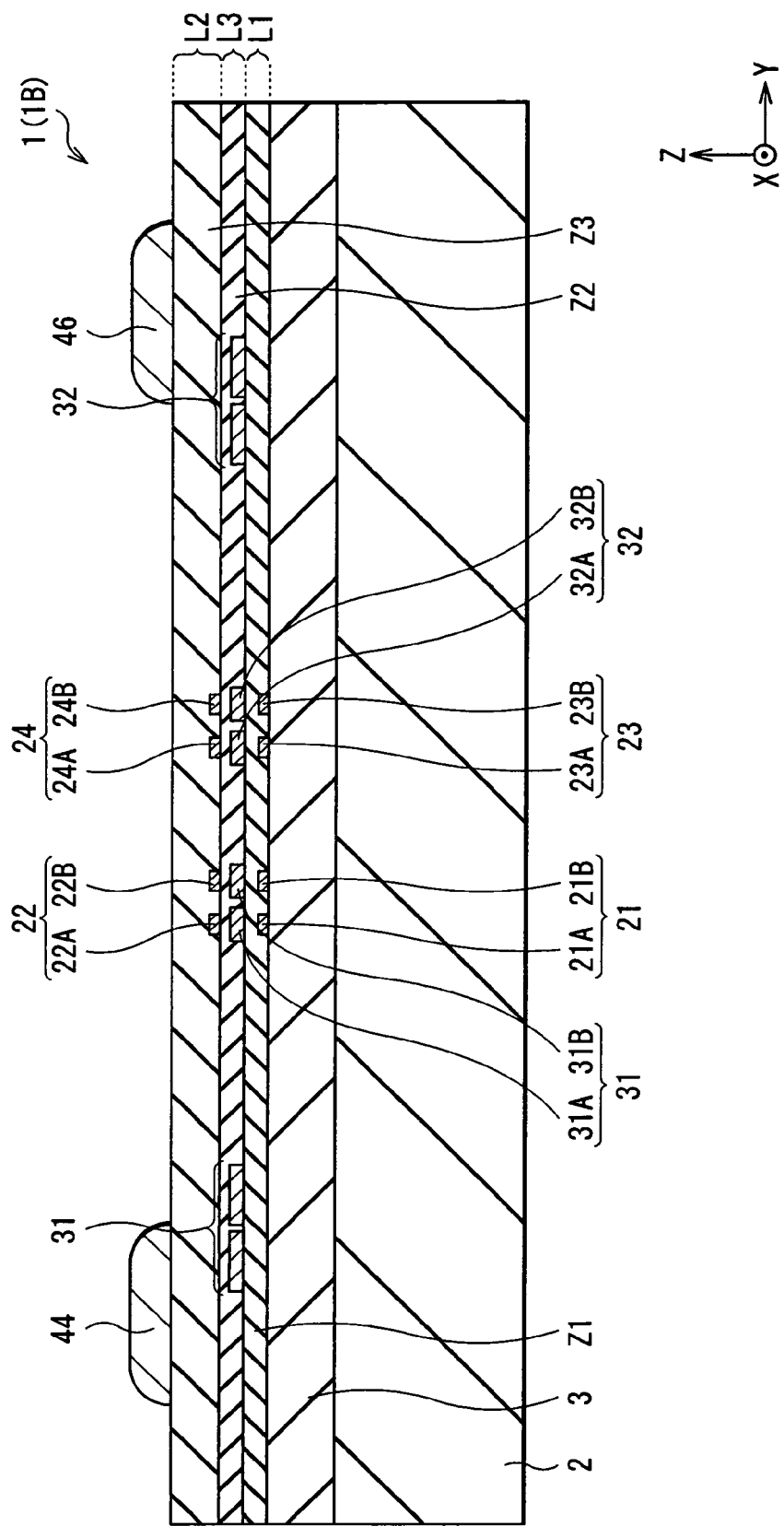
FIG. 11 is a cross section taken along line XI-XI of the current sensor illustrated in FIG. 10.

FIG. 10 is a schematic view illustrating a perspective configuration of the current sensor 1B. FIG. 11 shows a sectional configuration taken along line XI-XI of the current sensor 1B illustrated in FIG. 10 seen from the direction indicated by the arrows (−X direction). The current sensor 1B is constructed by adding a second thin film coil 32 (hereinbelow, simply called the thin film coil 32), a third magnetoresistive element 23 (hereinbelow, simply called the MR element 23), and a fourth magnetoresistive element 24 (hereinbelow, simply called the MR element 24) to the current sensor 1A of the first embodiment.

The MR element 23 is formed so as to be connected in series to the MR element 21 in a region at the first level L1 other than the region in which the MR element 21 is formed, and includes strip-shaped element patterns 23A and 23B which are provided so as to extend in the X axis direction and be adjacent to each other in the Y axis direction. The element patterns 23A and 23B are connected in parallel to each other between the electrode pattern 5 and an electrode pattern 8. The MR element 24 is formed so as to be connected in series to the MR element 22 in a region at the second level L2 other than the region in which the MR element 22 is formed, and includes strip-shaped element patterns 24A and 24B which are provided so as to extend in the X axis direction and be adjacent to each other in the Y axis direction. The element patterns 24A and 24B are connected in parallel to each other between the electrode pattern 7 and an electrode pattern 9. Each of the element patterns 23A and 23B and the element patterns 24A and 24B is formed so as to have a width such as 0.8 μm by sputtering or the like. The electrode pattern 4 is connected to the electrode pattern 6 and the electrode film 43 via a contact layer (not shown) and the electrode pattern 5 is connected to an electrode film 48 via a contact layer (not shown). Further, the electrode pattern 8 is connected to the electrode pattern 9 and an electrode film 47 via a contact layer (not shown) and the electrode pattern 7 is connected to the electrode film 44.

Further, the thin film coil 32 is a thin film pattern made of a metal material having high conductivity such as copper (Cu) in a manner similar to the thin film coil 31, and constructed so as to wind in a region at the third level L3 other than the region in which the thin film coil 31 is formed. The thin film coil 32 includes winding body portions 32A and 32B which extend in the X axis direction in correspondence with the element patterns 23A and 23B of the MR element 23 and the element patterns 24B and 24B of the MR element 24, respectively. The end 31E of the thin film coil 31 is connected to one end 32S of the thin film coil 32 via the electrode films 42 and 45, and the other end 32E of the thin film coil 32 is connected to an electrode film 46 via a contact layer (not shown). Therefore, the thin film coil 31 and 32 are formed as one conductor in the circuit configuration.

Figure 12:
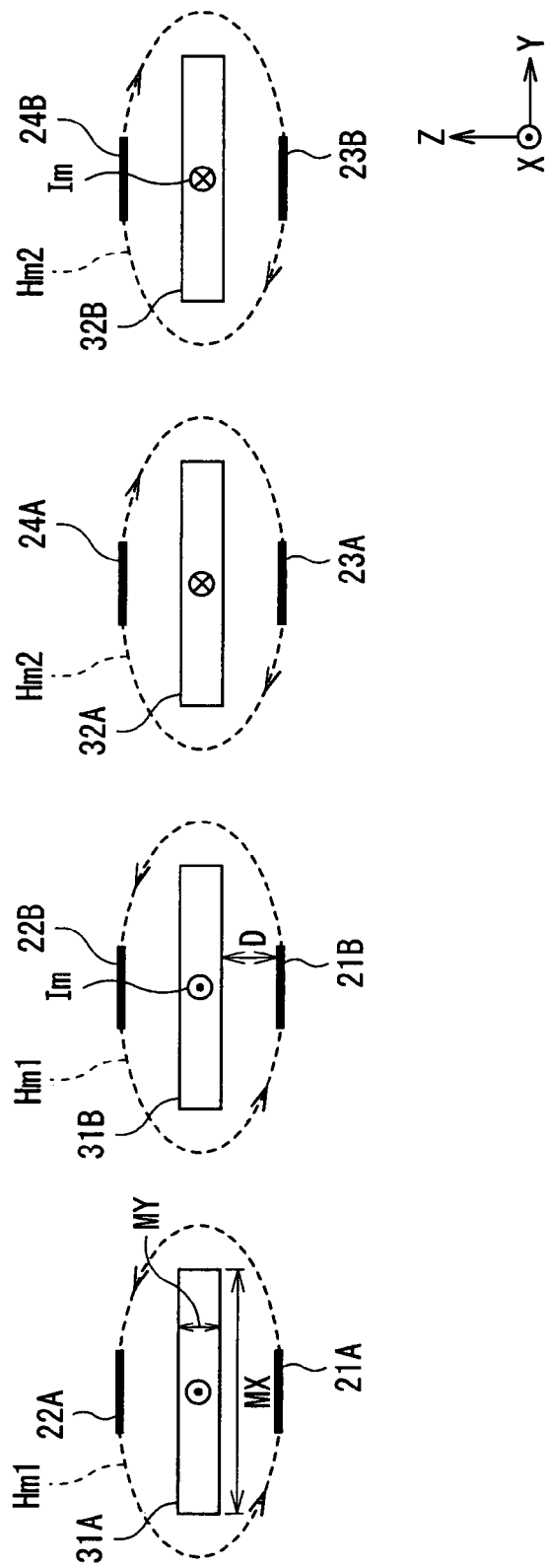
FIG. 12 is an enlarged cross section of a main part of FIG. 11.

In the current sensor 1B having such a configuration, the current Im to be detected passes through the thin film coil 31 and flows in the thin film coil 32, thereby applying, as shown in FIG. 12, the current magnetic field Hm1 to the element patterns 21A, 21B, 22A, and 22B and applying the current magnetic field Hm2 to the element patterns 23A, 23B, 24A, and 24B of the MR elements 23 and 24. FIG. 12 is an enlarged view of a part of FIG. 11 and an explanatory drawing for explaining action of the current magnetic field Hm1 on the element patterns 21A, 21B, 22A, and 22B and action of the current magnetic field Hm2 on the element patterns 23A, 23B, 24A, and 24B. In the element patterns 21A and 21B and the element patterns 22A and 22B, the resistance values change according to the current magnetic field Hm1 applied. Similarly, in the element patterns 23A and 23B and the element patterns 24A and 24B, the resistance values change according to the current magnetic field Hm2. At this time, the resistance values of the element patterns 22A and 22B and the element patterns 23A and 23B change in the direction opposite to that of the resistance values of the element patterns 21A and 21B generated by the current magnetic field Hm1. Further, the resistance values of the element patterns 24A and 24B change in the same direction as that of the resistance values of the element patterns 21A and 21B.

For example, a bias magnetic field having a strength corresponding to the bias point BP1 (refer to FIG. 6) is preliminarily applied to each of the element patterns 21A, 21B, 22A, and 22B in the +Y direction. When the current Im to be detected is passed to the winding body portions 31A and 31B in the +X direction as shown in FIG. 12, the current magnetic field Hm1 in the +Y direction is applied to the element patterns 21A and 22B. Therefore, as is the evident from FIG. 6, the resistance change ratio increases (the resistance value increases). On the other hand, since the current magnetic field Hm1 in the −Y direction is applied to the element patterns 22A and 22B, as is evident from FIG. 6, the resistance change ratio decreases (the resistance value decreases). Similarly, when the bias magnetic field having a strength corresponding to the bias point BP1 (refer to FIG. 6) in the +Y direction is preliminarily applied to each of the element patterns 23A, 23B, 24A, and 24B and the current Im to be detected in the −Y direction flows to the winding body portions 32A and 32B as shown in FIG. 12, the current magnetic field Hm2 in the −Y direction is applied to the element patterns 23A and 23B. Consequently, as is evident from FIG. 6, the resistance change ratio decreases (the resistance value decreases). On the other hand, the current magnetic field Hm2 in the +Y direction is applied to the element patterns 24A and 24B, so that, as is evident from FIG. 6, the resistance change ratio increases (the resistance value increases).

Figure 13:
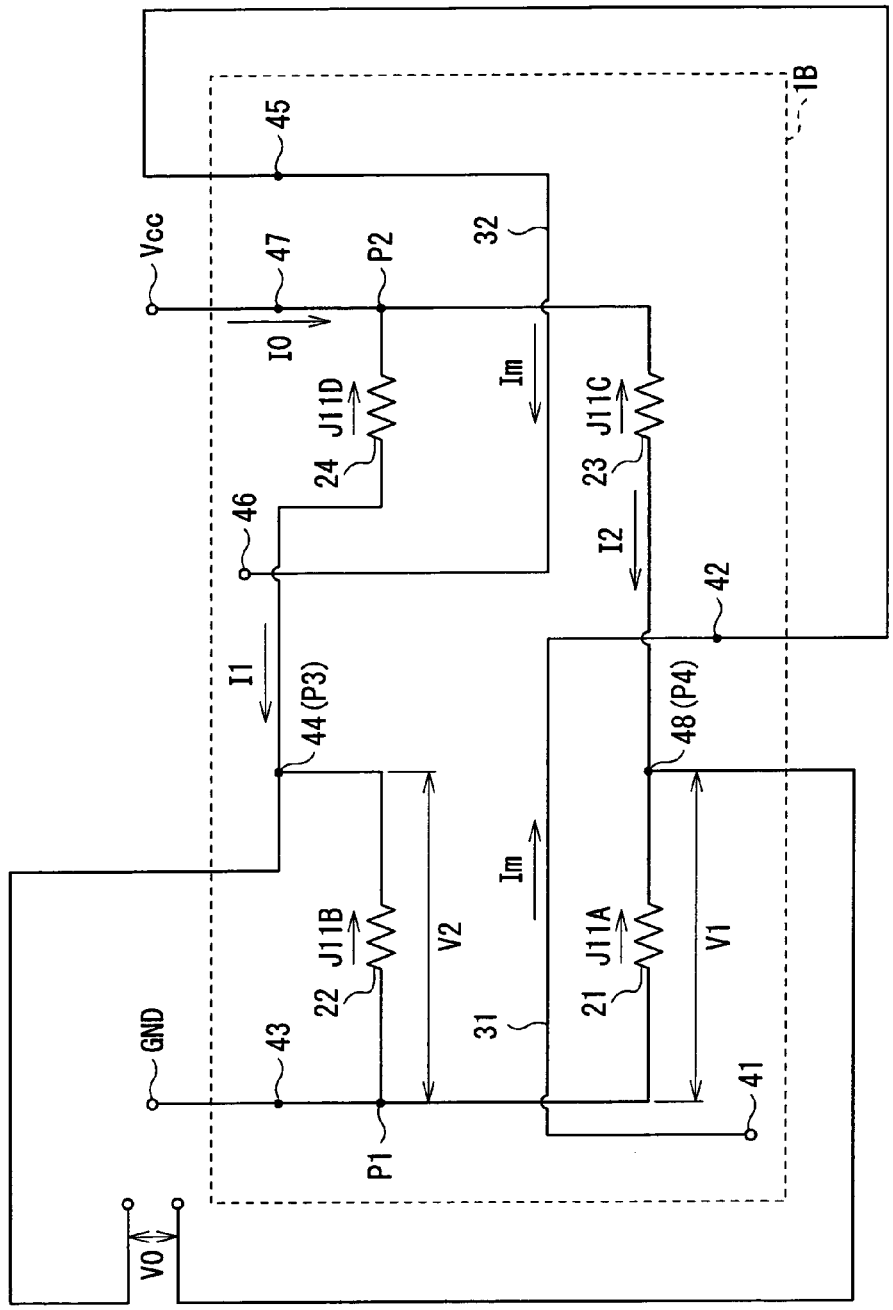
FIG. 13 is a circuit diagram corresponding to the current sensor shown in FIG. 10.

FIG. 13 is a schematic view showing a circuit configuration of an ammeter including the current sensor 1B shown in FIG. 10. In FIG. 13, a portion surrounded by a broken line corresponds to the current sensor 1B. As shown in FIG. 13, one end of the MR element 21 and one end of the MR element 22 are coupled to each other at the first connection point P1 and finally grounded via the electrode film 43. One end of the MR element 23 and one end of the MR element 24 are connected to each other at the second connection point P2. Further, the end of the MR element 21 on the side opposite to the first connection point P1 and the end of the MR element 24 on the side opposite to the second connection point P2 are connected to each other at the electrode film 44 as the third connection point P3. The end of the MR element 22 on the side opposite to the first connection point P1 and the end of the MR element 23 on the side opposite to the second connection point P2 are connected to each other at the electrode 48 as the fourth connection point P4. In such a manner, a bridge circuit is constructed so that the current Im to be detected is detected on the basis of a potential difference V0 between the third and fourth connection points P3 and P4 when a voltage is applied across the first and second connection points P1 and P2.

Figure 14:
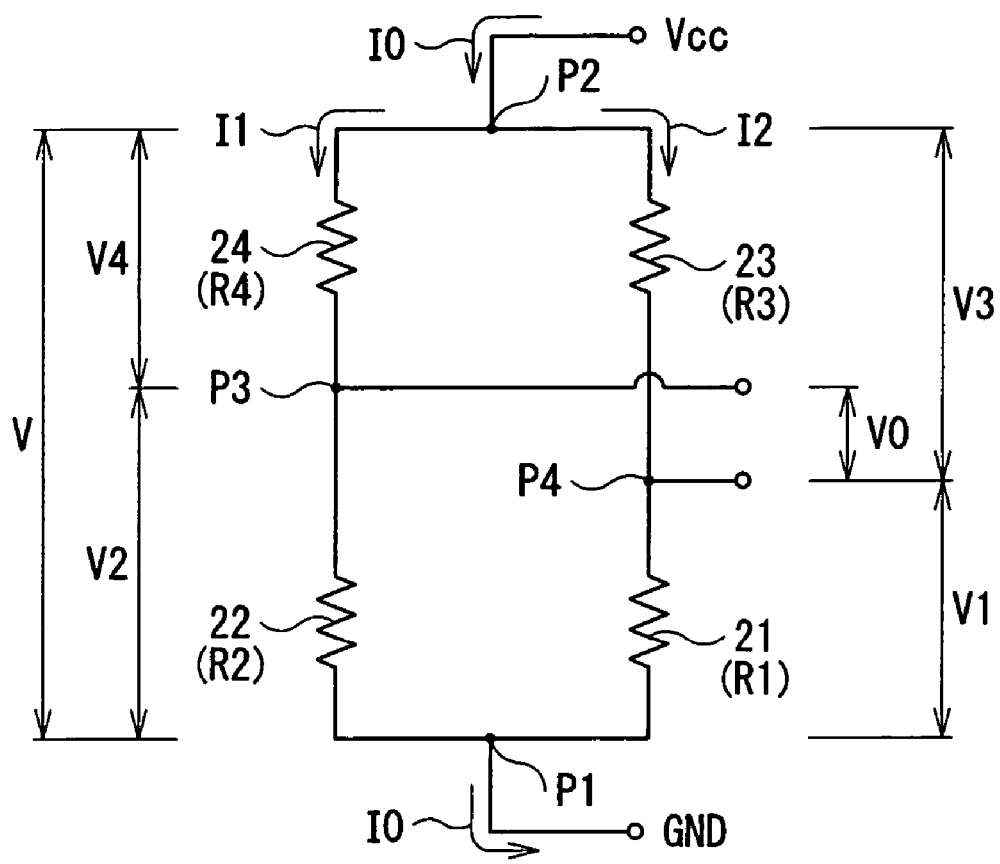
FIG. 14 is an enlarged view of a main part of the circuit diagram of FIG. 13.

A method of measuring the current magnetic fields Hm1 and Hm2 generated by the current Im to be detected will be described hereinbelow by referring to FIG. 14 in addition to FIG. 13. FIG. 14 is a simplified circuit diagram of a main part of FIG. 13.

In FIG. 14, the resistance values of the MR elements 21 to 24 when a read current I0 flows in the state where the current magnetic fields Hm1 and Hm2 are not applied are expressed as R1 to R4, respectively. The read current I0 is diverted at the second connection point P2. After that, a read current I1 passed through the MR elements 24 and 22 and a read current I2 passed through the MR elements 23 and 21 join at the first connection point P1. In this case, the potential difference V between the second and first connection points P2 and P1 can be expressed as follows.

$$V = I1 \cdot R4 + I1 \cdot R2 \quad (4)$$
$$= I2 \cdot R3 + I2 \cdot R1$$
$$= I1(R4 + R2)$$
$$= I2(R3 + R1)$$

A potential V2 at the third connection point P3 and a potential V1 at the fourth connection point P4 are expressed as follows.

$$V2 = V - V4$$
$$= V - I1 \cdot R4$$

-continued
$$V1 = V - V3$$
$$= V - I2 \cdot R3$$

Therefore, the potential difference V0 between the third and fourth connection points P3 and P4 is expressed as follows.

$$V0 = V2 - V1 \quad (5)$$
$$= (V - I1 \cdot R4) - (V - I2 \cdot R3)$$
$$= I2 \cdot R3 - I1 \cdot R4$$

From Equation (4), the following is derived.

$$V0 = R3/(R3 + R1) \cdot V - R4/(R4 + R2) \cdot V \quad (6)$$
$$= \{R3/(R3 + R1) - R4/(R4 + R2)\} \cdot V$$

In the bridge circuit, when the current magnetic fields Hm1 and Hm2 are applied, by measuring the potential V0 between the third and fourth connection points P3 and P4 expressed by the equation (6), the resistance change amount is obtained. It is assumed that when the current magnetic fields Hm1 and Hm2 are applied, the resistance values R1 to R4 increase only by change amounts ΔR1 to ΔR4, respectively, that is, the resistance values R1 to R4 change as follows.

R1→R1+ΔR1
R2→R2+ΔR2
R3→R3+ΔR3
R4→R4+ΔR4

After applying the current magnetic fields Hm1 and Hm2, from Equation (6), the following is obtained.

$$V0=\{(R3+\Delta R3)/(R3+\Delta R3+R1+\Delta R1)-(R4+\Delta R4)/(R4+\Delta R4+R2+\Delta R2)\} \cdot V \quad (7)$$

As already described above, in the current sensor 1B, the resistance values R1 and R4 of the MR elements 21 and 24 change in the direction opposite to that of the resistance values R2 and R3 of the MR elements 22 and 23 (since the current magnetic fields Hm1 and Hm2 in the directions opposite to each other are applied to the MR elements 22 and 23 and to the MR elements 21 and 24, the bias magnetic field in the same direction is applied in advance to all of the MR elements 21 to 24). Consequently, the change amounts ΔR3 and ΔR1 cancel out each other and the change amounts ΔR4 and ΔR2 cancel out each other. Therefore, when the states of both before and after application of the current magnetic fields Hm1 and Hm2 are compared to each other, the denominator in each of terms of equation (7) hardly increases. On the other hand, since the change amounts ΔR3 and ΔR4 always have signs opposite to each other, they cancel out each other and a numerator of each of the terms increases/decreases for the following reason. As is evident from FIG. 6, when the current magnetic fields Hm1 and Hm2 in the +Y direction are applied in the state where the bias magnetic field corresponding to the bias point BP1 is preliminarily applied, the resistance values change (substantially, increase) only by the change amounts ΔR1 and ΔR4 (ΔR1, ΔR4>0) in the MR elements 21 and 24. On the other hand, the resistance values change (substantially, decrease) only by the change amounts ΔR2 and ΔR3 (ΔR2, ΔR3<0) in the MR elements 22 and 23.

When it is assumed that the MR elements 21 to 24 have the same characteristics, that is, R=R1=R2=R3=R4 and

ΔR1=−ΔR1=ΔR2=ΔR3=−ΔR4,

Equation (7) is calculated as follows.

$$V0 = \{(R + \Delta R)/(2R) - (R - \Delta R)/(2R)\} \cdot V$$
$$= (\Delta R/R) \cdot V$$

As described above, by using the MR elements 21 to 22 whose characteristic values such as the resistance change ratio ΔR/R are grasped in advance, the magnitude of the current magnetic field Hm1 and Hm2 can be obtained, and the magnitude of the current Im to be detected that generates the current magnetic fields Hm1 and Hm2 can be estimated. In particular, by constructing a bridge circuit and performing sensing, as compared with sensing performed by a single element pattern having equivalent output, the influence of variations in the characteristics in the MR elements is reduced, a larger resistance change amount in the element pattern of each of the MR elements can be detected, and precision of measurement values be can improved. In the embodiment, the magnetization directions J11A to J11D of the pinned layers 11 in all of the MR elements 21 to 24 are set to be the same, so that the magnetization directions J11A to J11D form the same angle to the direction of the current magnetic field Hm. Thus, it is relatively easy to suppress variations in the detection sensitivity in the MR elements 21 to 24.

As described above, the current sensor 1B of the embodiment has the configuration obtained by adding the thin film coil 32 coupled to the thin film coil 31, and the MR elements 23 and 24 corresponding to the thin film coil 32 to the configuration of the current sensor 1A of the first embodiment. Consequently, it is possible to construct a bridge circuit and perform sensing, and the precision of measurement values of the current Im to be detected can be further increased. In this case, the MR element 23 is provided at the same first level L1 as that of the MR element 21, and the MR element 24 is provided at the same second level L2 as that of the MR element 22. Therefore, the compact configuration can be maintained as a whole.

Although the present invention has been described by the embodiments above, the invention is not limited to the foregoing embodiments but can be variously modified. For example, although the magnetoresistive element having the spin valve structure in which the magnetization direction of the pinned layer and the direction of the easy axis of magnetization of the free layer coincide with each other is employed in the embodiments, the invention is not limited to the configuration. For example, a magnetoresistive element having a spin valve structure in which the magnetization direction of the pinned layer and the direction of the easy axis of magnetization of the free layer are orthogonal to each other may be used.

Although each of the first to the fourth magnetoresistive elements is constructed by the two element patterns in the embodiments, the invention is not limited to the configuration, but each of the magnetoresistive elements may be constructed by three or more element patterns.

Figure 15:
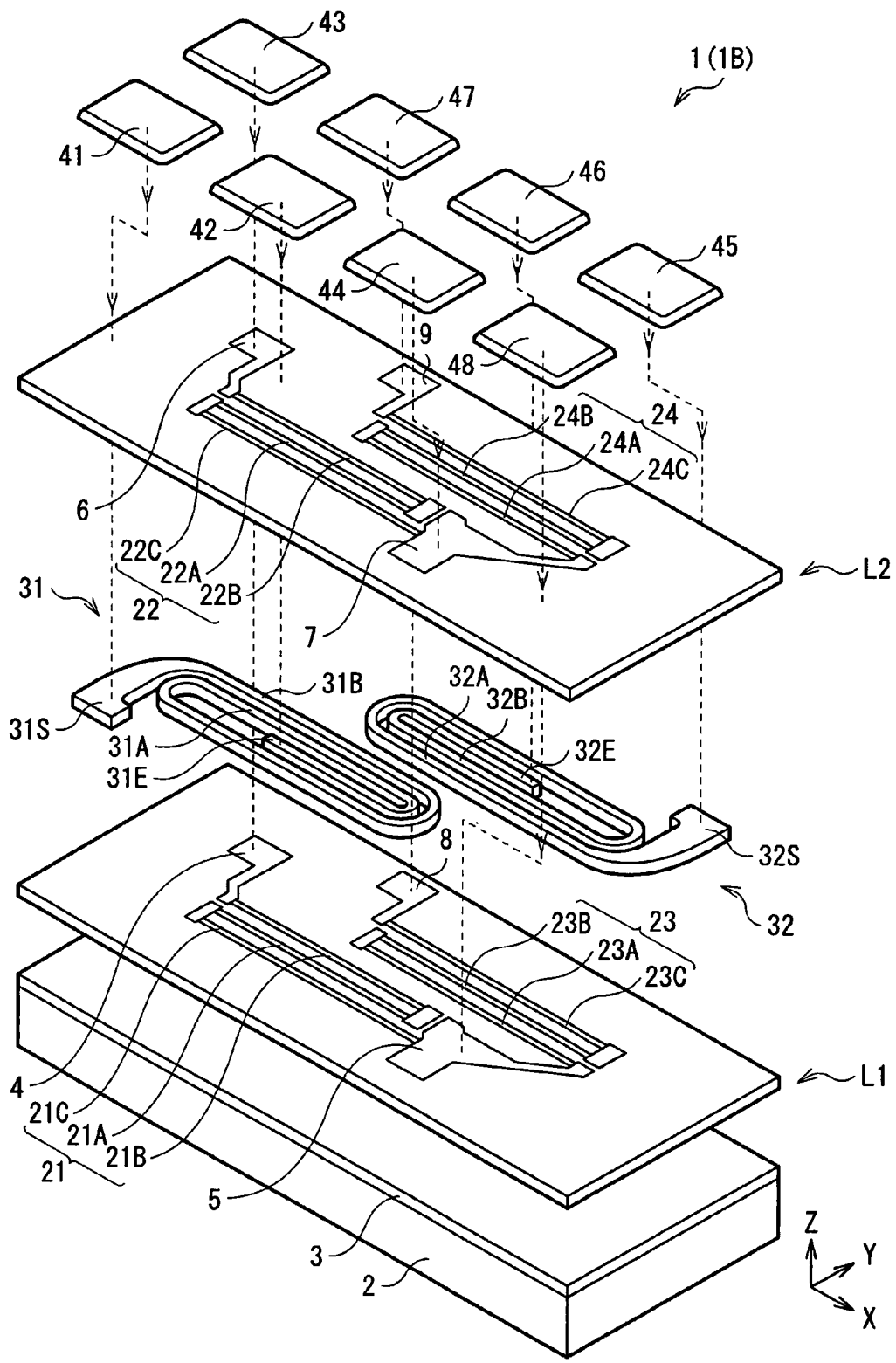
FIG. 15 is a perspective view showing the configuration of a modification of the current sensor illustrated in FIG. 10.

Further, although the element patterns in the first to the fourth magnetoresistive elements are connected in parallel to each other in the embodiments, the element patterns may be connected in series as in a current sensor 1E as shown in FIG. 15. In this case, without increasing the dimension in the first direction, the total length of an element pattern functioning as a magnetosensitive part can be increased and the absolute value of the whole resistance value (impedance) in each of the first and second magnetoresistive elements can be increased. Therefore, even a weaker current to be detected can be measured with high precision.

The current sensor of the invention is used to measure a current value itself as described in the foregoing embodiments and, further, can be also applied to an eddy current inspection technique for inspecting a defective in printed wiring and the like. In an example of application, a current sensor is constructed by arranging a number of magnetoresistive elements on a straight line and a change in an eddy current is grasped as a change in a magnetic flux.

What is claimed is:

1. A current sensor comprising:
   a first magnetoresistive element which includes a plurality of strip-shaped element patterns extending in a first direction and disposed so as to be adjacent to each other in a second direction orthogonal to the first direction at a first level;
   a second magnetoresistive element which includes a plurality of strip-shaped element patterns extending in the first direction and disposed so as to be adjacent to each other in the second direction at a second level different from the first level; and
   a first thin film coil which winds at a third level positioned between the first and second levels while including a plurality of first winding body portions extending in the first direction in correspondence with each of the element patterns of the first and second magnetoresistive elements, the first thin film coil applying a first current magnetic field from each of the plurality of first winding body portions to each of the element patterns of the first and second magnetoresistive elements when an unknown current to be detected is supplied to the first thin film coil.

2. A current sensor according to claim 1, wherein resistance values of the first and second magnetoresistive elements change in directions opposite to each other in accordance with the first current magnetic field.

3. A current sensor according to claim 1, wherein each of the element patterns in the first and second magnetoresistive elements is connected in parallel to each other.

4. A current sensor according to claim 1, wherein each of the element patterns of the first and second magnetoresistive elements is connected in series to each other.

5. A current sensor according to claim 1, wherein each of the element patterns in the first and second magnetoresistive elements has a magnetization pinned film magnetized in the first direction.

6. A current sensor according to claim 1, wherein each of the element patterns in the first and second magnetoresistive elements is constructed so that a longitudinal dimension along the first direction is 10 times to 200 times as large as a width dimension along the second direction.

7. A current sensor according to claim 6, wherein the width dimension along the second direction is in a range from 0.5 μm to 2.0 μm.

8. A current sensor according to claim 1, further comprising:
   a third magnetoresistive element which includes a plurality of strip-shaped element patterns extending in the first direction and disposed so as to be adjacent to each other in the second direction, and the third magnetoresistive element being formed at the first level in a region other than a region where the first magnetoresistive element is formed so as to be connected in a series to the first magnetoresistive element;

a fourth magnetoresistive element which includes a plurality of strip-shaped element patterns extending in the first direction and disposed so as to be adjacent to each other in the second direction, the fourth magnetoresistive element being formed in a region other than a region where the second magnetoresistive element at the second level is formed so as to be connected in series to the second magnetoresistive element;

a second thin film coil which winds in a region other than a region where the first thin film coil at the third level is formed so as to include a plurality of second winding body portions extending in the first direction in correspondence with each of the element patterns of the third and fourth magnetoresistive elements, the second thin film coil applying a second current magnetic field from each of the plurality of second winding body portions to each of the element patterns of the third and fourth magnetoresistive elements when the unknown current to be detected is supplied to the second thin film coil.

9. A current sensor according to claim 8, wherein a resistance value of the second magnetoresistive element changes in the direction opposite to that of the first magnetoresistive element in accordance with the first current magnetic field, a resistance value of the third magnetoresistive element changes in accordance with the second current magnetic field in the direction opposite to that of the first magnetoresistive element generated by the first current magnetic field, and a resistance value of the fourth magnetoresistive element changes in accordance with the second current magnetic field in the same direction as that of the first magnetoresistive element generated by the first current magnetic field.

10. A current sensor according to claim 8, wherein the element patterns in each of the first to fourth magnetoresistive elements are connected in parallel to each other.

11. A current sensor according to claim 8, wherein the element patterns in each of the first to fourth magnetoresistive elements are connected in series to each other.

12. A current sensor according to claim 8, wherein each of the element patterns in the first to fourth magnetoresistive elements has a magnetization pinned film magnetized in the first direction.

13. A current sensor according to claim 8, wherein a longitudinal dimension along the first direction of each of the element patterns in the first to fourth magnetoresistive elements is 10 times to 200 times as large as a width direction along the second direction.

14. A current sensor according to claim 13, wherein the width dimension along the second direction is in a range from 0.5 µm to 2.0 µm.

15. A current sensor according to claim 8, wherein a bridge circuit is constructed in such a manner that one end of the first magnetoresistive element and one end of the second magnetoresistive element are connected to each other at a first connection point, one end of the third magnetoresistive element and one end of the fourth magnetoresistive element are connected to each other at a second connection point, the other end of the first magnetoresistive element and the other end of the fourth magnetoresistive element are connected to each other at a third connection point, and the other end of the second magnetoresistive element and the other end of the third magnetoresistive element are connected to each other at a fourth connection point, and on the basis of a potential difference between the third and fourth connection points occurring when a voltage is applied across the first and second connection points, the current to be detected is detected.

* * * * *